United States Patent
Fischer et al.

(10) Patent No.: US 9,564,285 B2
(45) Date of Patent: Feb. 7, 2017

(54) HYBRID FEATURE ETCHING AND BEVEL ETCHING SYSTEMS

(71) Applicant: Lam Research Corporation, Fremont, CA (US)

(72) Inventors: Andreas Fischer, Castro Valley, CA (US); John Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 351 days.

(21) Appl. No.: 13/942,502

(22) Filed: Jul. 15, 2013

(65) Prior Publication Data

US 2015/0013906 A1    Jan. 15, 2015

(51) Int. Cl.
*H01J 37/32* (2006.01)
*H01J 37/00* (2006.01)

(52) U.S. Cl.
CPC .......... *H01J 37/00* (2013.01); *H01J 37/32091* (2013.01); *H01J 37/32366* (2013.01); *H01J 37/32385* (2013.01); *H01J 37/32568* (2013.01); *H01J 37/32642* (2013.01); *H01L 2221/00* (2013.01)

(58) Field of Classification Search
CPC   H01J 37/00; H01J 37/32091; H01J 37/32366; H01J 37/32385; H01J 37/32568; H01J 37/32642; H01L 2221/00
See application file for complete search history.

(56) References Cited

U.S. PATENT DOCUMENTS

| | | | |
|---|---|---|---|
| 2002/0190657 A1* | 12/2002 | Han et al. | 315/111.21 |
| 2010/0098875 A1* | 4/2010 | Fischer et al. | 427/534 |
| 2011/0049101 A1* | 3/2011 | Juco et al. | 216/71 |

FOREIGN PATENT DOCUMENTS

JP          2005093843 A  *  4/2005

* cited by examiner

*Primary Examiner* — Jeffrie R Lund
*Assistant Examiner* — Yuechuan Yu
(74) *Attorney, Agent, or Firm* — Martine Penilla Group, LLP

(57) ABSTRACT

A plasma processing system having at least a plasma processing chamber for performing plasma processing of a substrate and utilizing at least a first processing state and a second processing state. Plasma is present above the center region of the substrate during the first processing stale to perform plasma processing of at least the center region during the first processing state. Plasma is absent above the center region of the substrate but present adjacent to the bevel edge region during the second processing state to at least perform plasma processing of the bevel edge region during the second processing state. During the second processing state, the upper electrode is in an RF floating state and the substrate is disposed on the lower electrode surface.

13 Claims, 9 Drawing Sheets

Feature Etch Mode

Bevel Etch Mode

HYBRID FEATURE ETCHING AND BEVEL ETCHING SYSTEMS

BACKGROUND OF THE INVENTION

In the manufacture of semiconductor products, substrates (e.g., semiconductor wafers) are processed by successively depositing, etching, and polishing various layers to create semiconductor devices. Plasmas and more specifically plasma-enhanced etching and deposition have often been employed in these processing steps.

For a given wafer there is a ring-shaped region at the outer edge of the substrate (known as the bevel region) where material deposition occurs and where said material needs to be removed in order to reduce defect and contamination risks on subsequent process steps. For example, during film deposition processes as well as during etch processes, deposition of organic and inorganic materials often builds up in the bevel area (e.g., especially at the very bevel of the wafer). Due to the curvature of the wafer bevel, the films are often deposited in the bevel area with a significant amount of built-in mechanical stress. If the deposition is not removed through successive processing steps, stress may accumulate in the film stack. As a result, some of the deposited material may flake off and cause defects on the devices being formed on the substrate, in which case the yield on the substrate may be adversely affected by several percent.

To reduce and/or minimize the possibility that the deposited material in this ring-shaped edge region could flake off and lower device yield, semiconductor device manufacturers have interleaved one or more bevel etch steps in between device-forming processing steps, such as feature etching steps or material deposition steps.

In the present disclosure, etching is employed to discuss various examples although it should be understood that embodiments of the invention may readily apply to deposition processes as well. With respect to etching, bevel etching step(s) may be interleaved with device-forming etching steps (also referred herein as "feature etching" or "feature etch" steps), for example. In a typical bevel etch step, the device-forming region (referred to herein as the "feature region") of the substrate is not processed with plasma. Rather, a bevel etch apparatus is employed to form a ring-shaped plasma near the periphery of the substrate to etch away some or all of the accumulated material at the substrate's outer edge. By interleaving one or more bevel etch steps into the device manufacturing process, undue built-up of accumulated deposition in the aforementioned ring-shaped edge region is removed. Accordingly, the possibility that some of the accumulated deposition m the ring-shaped edge region of the substrate may flake off is substantially reduced, leading to improved device yield.

In the past, feature etching (i.e., etching, to form electronic features on the substrate) and bevel etching are performed using different plasma processing chambers. This necessitates the use of multiple cluster tools with multiple chambers and/or multiple plasma processing systems as well as complicated and/or time-consuming substrate transferring steps to move substrates in and out of different chambers to performed the aforementioned bevel etch steps in between some of the feature etch steps or deposition steps Of a deposition process is involved).

As with most technology areas surrounding the manufacture of semiconductor products, constant innovation and improvement are required to reduce semiconductor manufacturing cost and/or time and/or complexity. The present invention relates to innovative hybrid feature/bevel plasma etch systems for performing either feature etching or bevel etching in the same chamber.

SUMMARY OF THE INVENTION

The invention relates, in an embodiment, to a plasma processing system having at least a plasma processing chamber for processing a substrate using plasma, the substrate having at least a center region and a bevel edge region. There is included a lower electrode configured for supporting the substrate during the processing. There are also included an upper electrode and control logic to operate the plasma processing system in at least a first processing state and a second processing state. The control logic causes the plasma to be present above the center region of the substrate during, the first processing state to at least perform plasma processing of the center region during the first processing state. The control logic causes the plasma to be absent above the center region of the substrate but present adjacent to the bevel edge region during the second processing state to at least perform plasma processing of the bevel edge region during the second processing state. The control logic further causes the upper electrode to be in an RE floating state during the second processing state. The substrate is disposed on the surface of the lower electrode during both the first processing state and the second processing state.

The invention relates, in another embodiment, to a plasma processing system having at least a plasma processing chamber for processing a substrate using plasma, the substrate having at least a center region and a bevel edge region. There is included a lower electrode configured for supporting the substrate during the processing. There are also included an upper electrode and control logic to operate the plasma processing system in at least a first processing state and a second processing state. The control circuitry moves the upper electrode in a direction parallel to a chamber center axis of the chamber to render a gap between a lower surface of the upper electrode and an upper surface of the substrate in the second processing state narrower relative to a gap between the lower surface of the upper electrode and the upper surface of the substrate that exists during, the first processing state. The control circuitry further switches a state of the upper electrode, if the state of the upper electrode during the fast processing, state is other than the RE floating state, to the RE floating state during the second processing state. The substrate is disposed on the surface of the lower electrode during both the first processing state and the second processing state.

BRIEF DESCRIPTION OF SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind, that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Embodiments of the invention relate to innovative plasma processing systems having one or more plasma processing chambers capable of performing either feature etch or bevel etch in the same chamber. For definition purposes, some term definitions are in order at this time.

Feature etch or feature etching refers to the etching of the substrate to create features, which are then employed in the formation of electronic devices such as, for example, transistors, memory devices, etc. The substrate feature region (i.e., the substrate surface region where features are formed) is disposed on at least one side of the substrate and extends from the geometric center of the substrate toward the edge of the substrate. There also exists a bevel edge region that is ring-shaped and disposed at the outer periphery of the substrate. In this bevel edge region, completed device formation is limited due to, tot example, the curved shape of the wafer at the bevel region.

Figure 1:
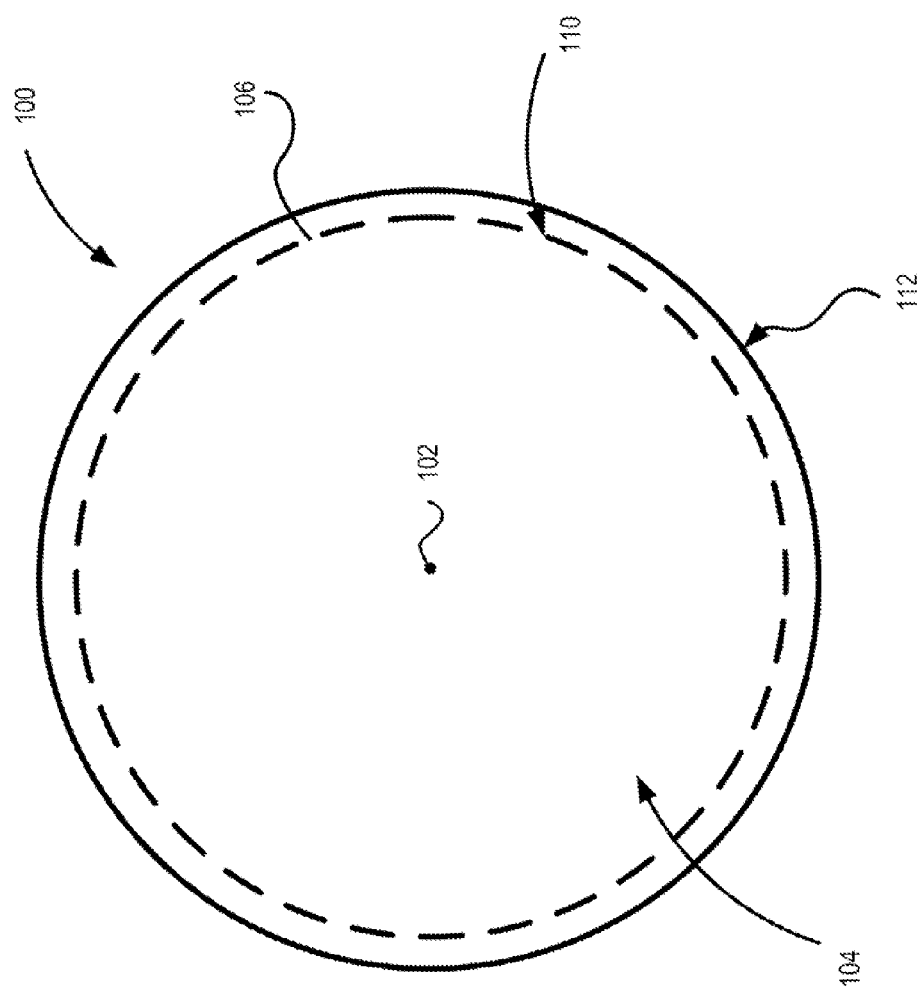
FIG. 1 shows an example substrate to facilitate discussion.

With respect to FIG. 1 (not to scale), substrate 100 is circular and has a geometric center 102. Feature region 104 is generally circular in shape and includes geometric center 102. Feature region 104 is shown extending from geometric center 102 to generally circular line 106, which is a conceptual feature region hunt (FRL) line that separates feature region 104 from bevel region 110. Feature etching occurs when plasma etches, in a selective or blanket manner, one or more layers in this feature region 104. Bevel region 110 extends from generally circular FRL line 106 to wafer outer periphery 112 and includes wafer outer periphery 112 (the extremity of which is typically referred to as the apex).

Figure 2:
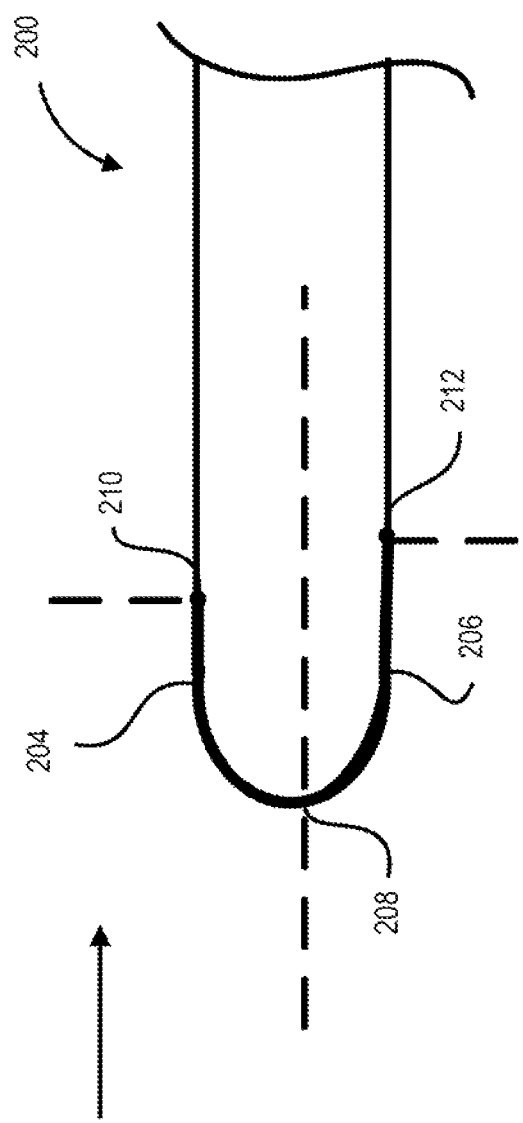
FIG. 2 shows an example bevel edge region of a substrate to facilitate discussion.

FIG. 2 shows a side view of the bevel surfaces of an example substrate 200. These bevel surfaces are typically processed via etching or deposition. These bevel surfaces include upper bevel surface 2014 (from point 208 to point 210 along the upper surface of the bevel edge) and lower bevel surface 206 (between point 208 and 212 along the lower surface of the bevel edge). As can be seen, bevel etching typically penetrates to some extent into the wafer (i.e., direction 230 toward the wafer geometric center from the wafer outer periphery) at both the upper bevel surface 204 and lower bevel surface 206. Also as can be seen, penetration depths can (but not required to be) different along the upper bevel surface and the lower level surface. Controlling the penetration depth is critical during bevel etching since it is undesirable to etch or damage the features that exist at the feature region/bevel region interface.

Referring back to FIG. 1, chip manufacturers generally try to utilize as much of the wafer surface area for device formation as possible. Accordingly, the exact position of feature region line 106 may vary since the ability of different processing systems to maintain uniform plasma and/or gas flow for processing, uniformity toward the wafer outer periphery may differ. While chip manufacturers generally prefer line 106 to be as close to the wafer outer periphery 112 as possible to maximize feature region 104 and minimize bevel region 110, this may not be possible in all cases.

For discussion clarity, a "center region" concept is introduced herein. As mentioned, bevel etching generally penetrates some distance from the substrate outer periphery toward the substrate geometric center. This penetration distance is intentionally limited (as can be seen in FIG. 2 wherein points 210 and 212 represent the bevel plasma penetration limit), and thus there is some portion of the substrate that would not be exposed to the bevel etch plasma during bevel etching even under the most extreme bevel etch scenario.

Figure 3:
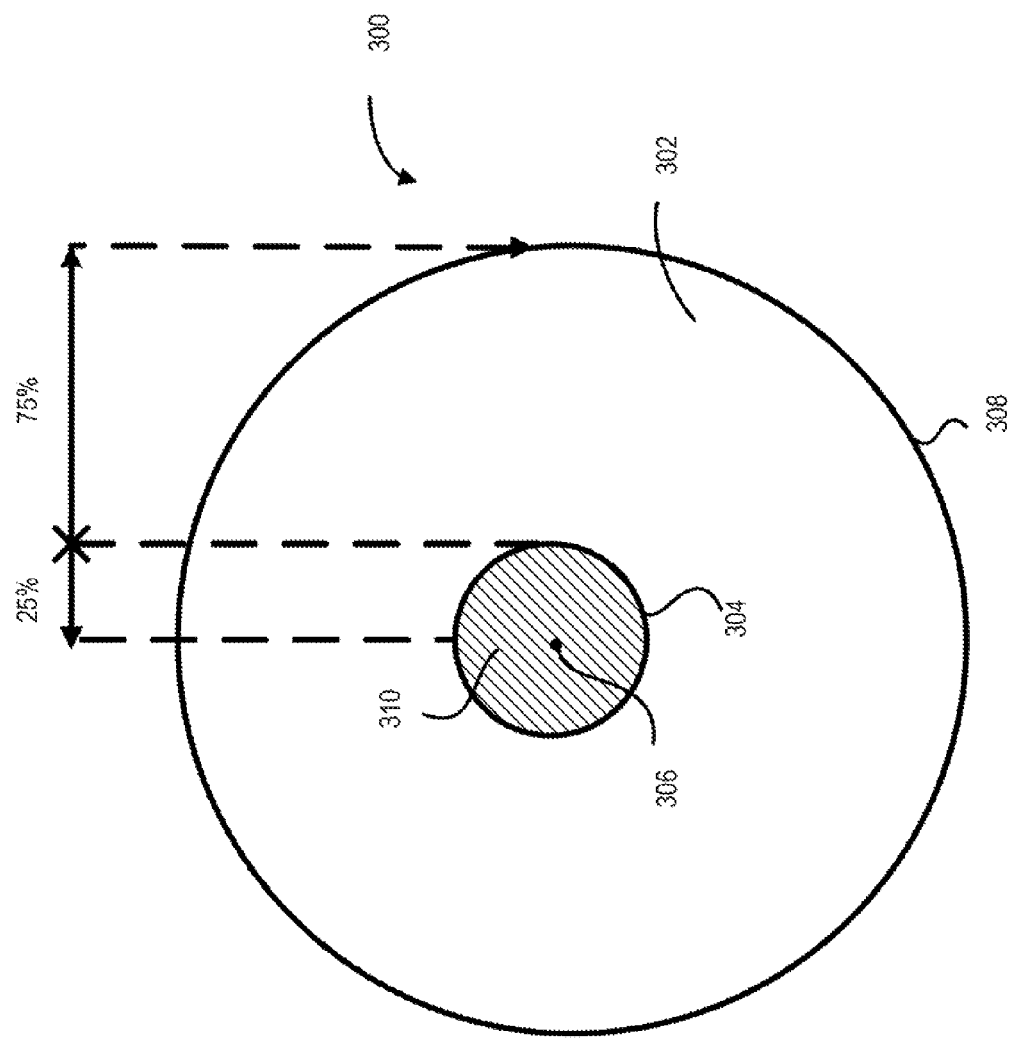
FIG. 3 shows another example substrate to facilitate discussion.

FIG. 3 shows a substrate 300 having a substrate surface 302 on which a conceptual demarcation line 304 is shown. This conceptual demarcation line 304 is 25% of the distance from the physical geometric center 306 of the wafer to the physical outer periphery 308 of the wafer. Center region 310 is shown extending from physical geometric center 306 (and includes physical geometric center 306 to demarcation line 304.

This center region concept is useful for discussion purpose since the "center region" clearly represents a substrate surface region that would not be exposed to the bevel etch plasma during bevel etching in any conceivable bevel etch scenario and thus would not be subject to etching during bevel etching. In contrast, the bevel region 110 of FIG. 1 is designed to be subject to the bevel etch plasma and to be etched during bevel etching since bevel region 110 includes at least the physical outer periphery of the wafer, which is exposed to the bevel plasma cloud during bevel etching.

Figure 4:
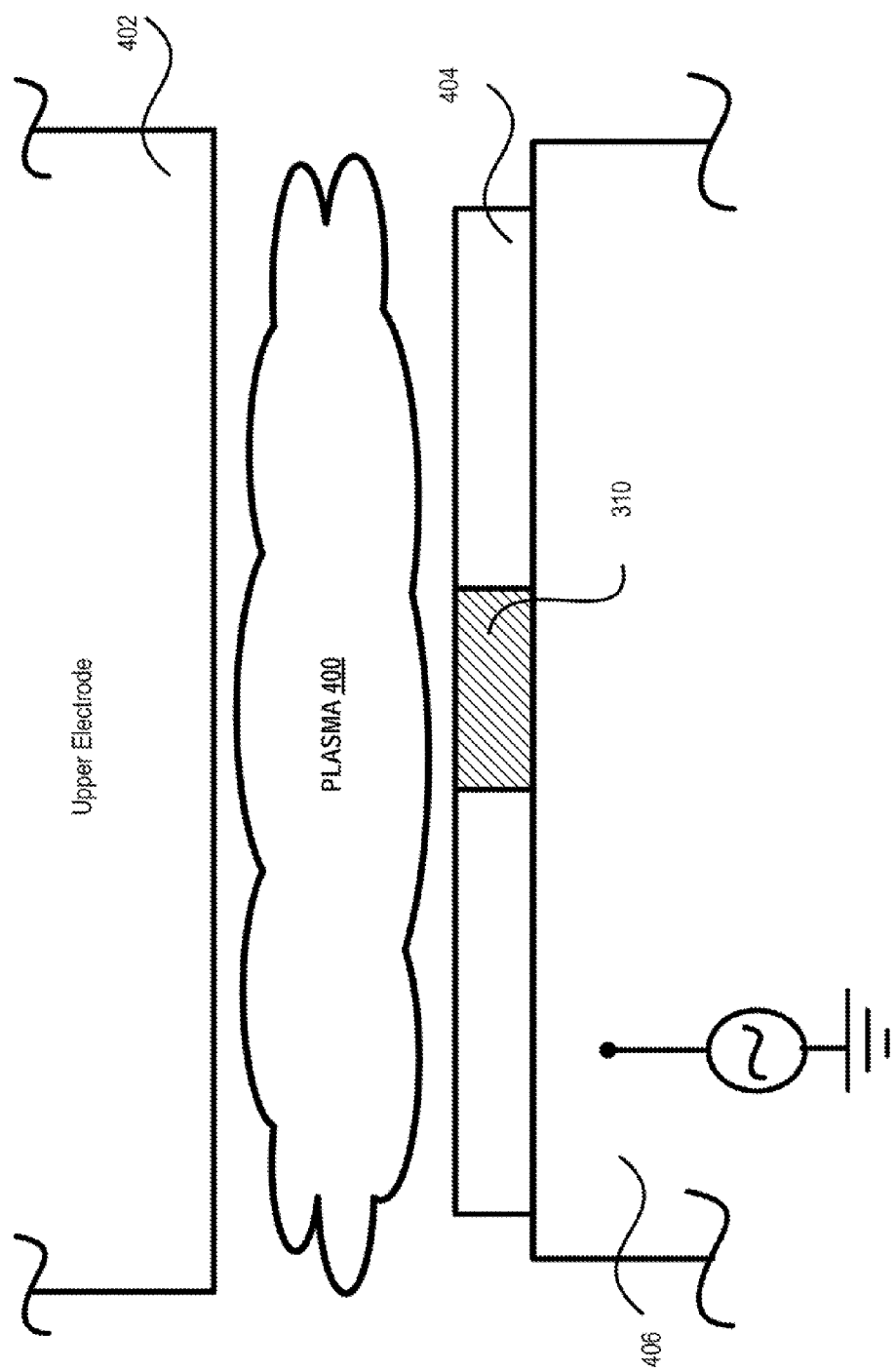
FIG. 4 shows the plasma that exists in the plasma processing chamber during feature etch or film deposition on the substrate surface.

During feature etch or film deposition, plasma exists at least above the center region 310 (and in reality also above all of feature region 104 of FIG. 1 and in many cases, above at least some or all of the bevel region). This is shown by conceptual FIG. 4 in which feature etch plasma 400 is shown disposed between upper electrode 402 and center region 310 of wafer 404, which is disposed on a lower electrode 406.

Figure 5:
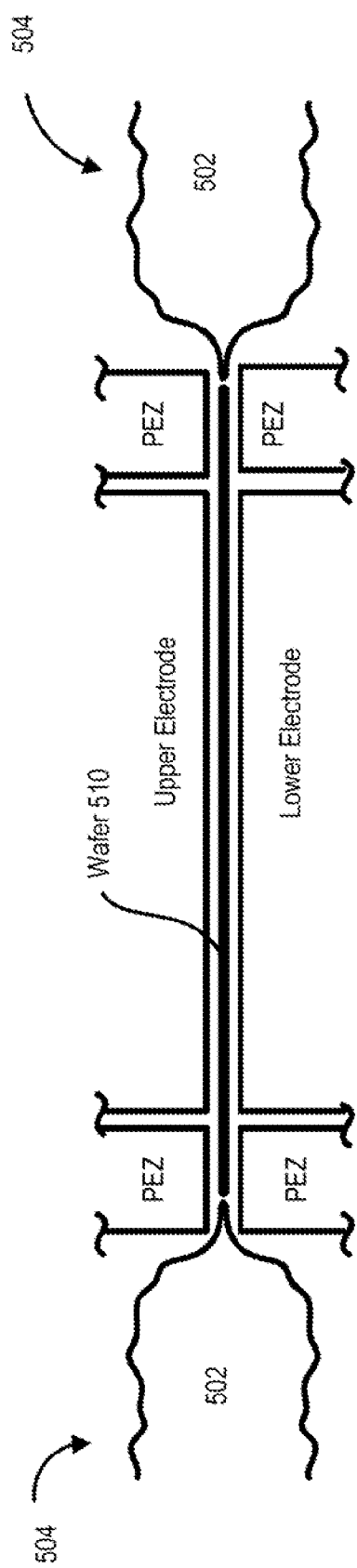
FIG. 5 shows the plasma that exists in the plasma processing chamber during bevel etch step.

During bevel etch, plasma does not exist above center region 310. In other words, neither feature etch plasma nor bevel etch plasma exists in the region above center region 310 of the wafer. Ideally, no plasma exists above or etches any feature in the feature region. Instead, plasma exists in the bevel plasma region, which is immediately adjacent to the bevel surfaces 204 and 206 of FIG. 2 to etch the bevel region of the wafer. FIG. 5 illustrates this situation wherein a bevel etch plasma 502 is shown disposed in bevel plasma region 504 that is immediately adjacent to bevel surfaces of wafer 510 to etch bevel surfaces of wafer 510. PEZ (Plasma Exclusion Zone) rings are also shown as they are often employed in traditional bevel etch chambers. These PEZ rings act to limit or tune the penetration of bevel etch plasma 502 toward the substrate center, contributing to the precise control of the bevel etch process.

In accordance with one or more embodiments of the invention, there is provided a hybrid plasma processing chamber configured to operate in either the feature etch mode or the bevel etch mode in the same chamber. In the feature etch mode, plasma exists at least above the substrate center region (and preferably above all of the feature region and above some or all of the bevel region) to etch the features on the substrate surface. In the bevel etch mode, no plasma is permitted to form above the substrate center region (and preferably no plasma is permitted to form or etch any feature in the feature region). Instead, a plasma is formed in the bevel plasma region that is adjacent to the bevel edge (i.e., the substrate outer periphery) to immerse the bevel edge in the bevel etch plasma in order to etch the bevel surfaces.

In one or more embodiments, the gap between the substrate upper surface (the substrate surface that faces the upper electrode) at the center region of the substrate and the lower surface (i.e., the surface that faces the substrate) of the upper electrode is set to be sufficiently large to sustain a feature etch plasma above the feature region of the substrate. For example, such gap is between about 1 centimeter to about 20 centimeters during feature etch.

During bevel etch, the gap between the substrate upper surface at the center region of the substrate and the lower surface of the upper electrode is set to be too narrow to sustain plasma above the feature region of the substrate (i.e., to inhibit plasma formation above the feature region of the substrate. For example, such gap in the bevel mode is below 1 mm, in one or more embodiments. In a typical bevel etch scenario, the aforementioned gap is about 0.35 mm, for example. As is evident from this discussion, the gap is significantly smaller in the bevel etch mode compared to the gap that exists in the feature etch mode.

In one or more embodiments, the upper electrode (including at least the upper electrode center portion that faces the center portion of the substrate) is formed of an RF-conducting material that is plasma-process compatible. The center portion of the substrate has been discussed in connection with FIG. 3 above. In one or more embodiments, the upper electrode is formed of, for example, low-resistivity silicon, low-resistivity silicon carbide, yttria or alumina coated aluminum.

In one or more embodiments, the upper electrode is switchable from a grounded state, which is employed for feature etching, to an RF floating state for bevel etching.

In one or more embodiments, the upper electrode is switchable from an RF-powered state, which is employed for feature etching, to an RF floating state for bevel etching.

In one or more embodiments, the upper electrode is in an RF floating state for both, feature etching and bevel etching.

In one or more embodiments, the tipper electrode is movable to transition the chamber from the feature etch mode to the bevel etch mode and vice versa.

In one or more embodiments, the lower electrode is movable to transition the chamber from the feature etch mode to the bevel etch mode and vice versa.

In one or more embodiments, both the lower electrode and the upper electrode are movable to transition the chamber from the feature etch mode to the bevel etch mode and vice versa.

In one or more embodiments, one or more PEZ (plasma exclusion zone) rings is/are provided and disposed outside of the outer periphery of the upper electrode. One or more of the PEZ rings is/are independently movable relative to the upper electrode in the direction that is parallel to the chamber center axis in order to tune the bevel etch plasma, in one or more embodiments. In other embodiments, one or more of the PEZ rings is/are fixed relative to the upper electrode.

In one or more embodiments, at least a first set of gas outlets and a second set a gas outlets are provided with the upper electrode assembly. In the bevel etch mode, etchant gas is injected out of the first set of outlets and into the bevel plasma region adjacent to and outside of the bevel edge of the wafer to form a plasma from the etchant gas to etch the bevel edge. A ballast (or buffer) gas such as argon or a similarly suitable gas may be injected in the center region (using, for example, the second set of gas outlets) to establish sufficient process pressure and to reduce pressurization time during bevel etch.

In one or more embodiments, control logic (which may be dedicated hardware or software working in conjunction with programmable hardware logic circuitry, or a combination thereof) is employed to move the upper electrode between the first processing state (which is feature processing step such as an etch process step or a deposition step) and the second processing state (which represents the bevel processing step). The control logic may also be employed to perform RF switching of the upper electrode and/or the PEZ ring to an RF floating state in the second processing state (i.e., the bevel processing state) as will be discussed later herein.

Etchant gas is injected, in the feature etch mode, out of the second set of gas outlets (which may be part of a showerhead assembly or may be a discrete set of outlets) into the gap above the wafer feature region (including the region above the center region) to form a plasma to etch features on the wafer or can be injected thru both gas outlets with different flow ratios for uniformity control.

It should be understood that a given hybrid feature-bevel etch chamber may be implemented using a single feature, multiple features, or all of the features discussed above in various combinations. These and other features and advantages of various embodiments of the invention may be better understood with reference to the figures and discussions that follow.

Figure 6:
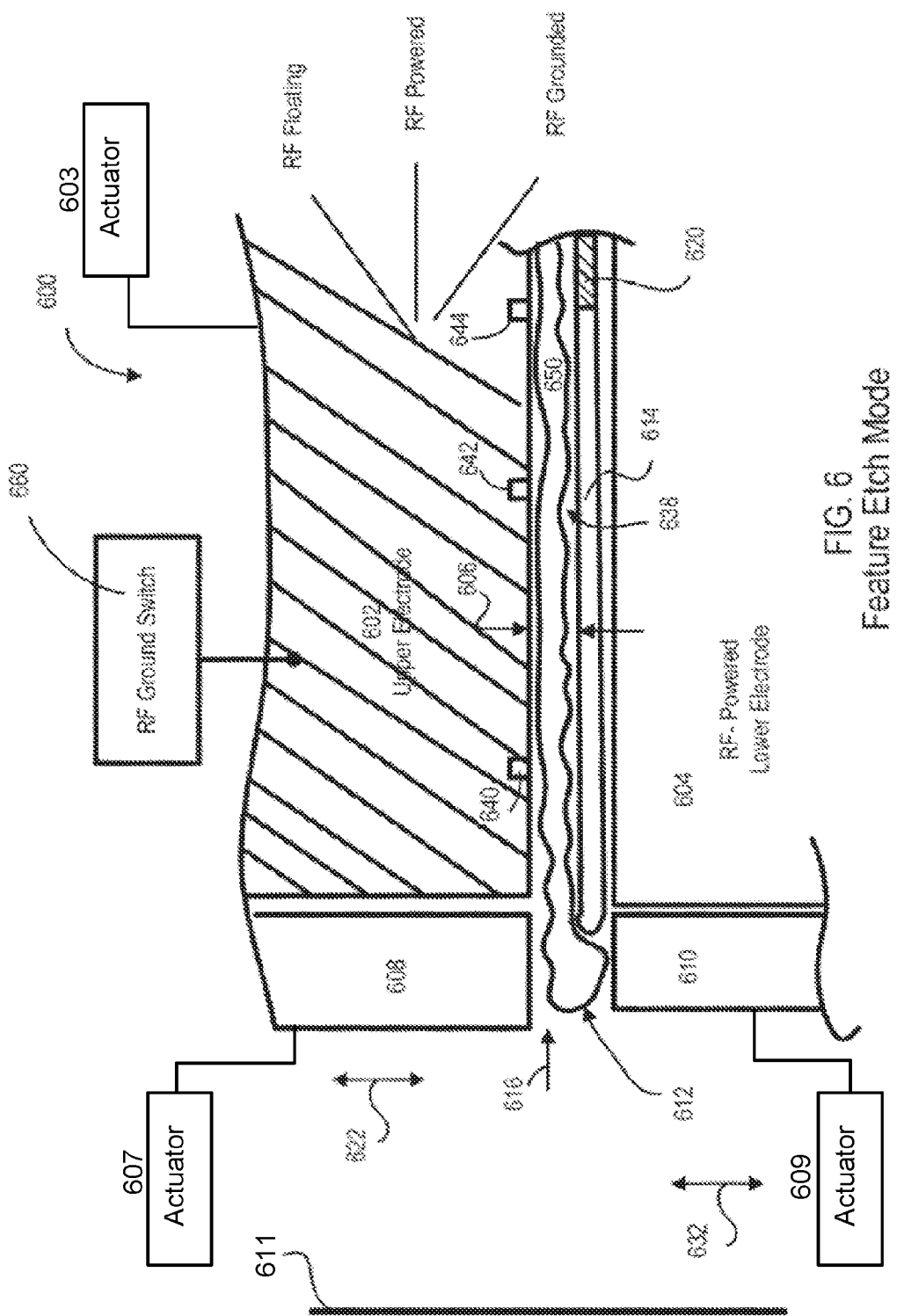
FIG. 6 shows, in accordance with an embodiment, a simplified side view representation of a hybrid feature/bevel etch chamber operating in the feature etch mode.

FIG. 6 shows, in accordance with an embodiment, a simplified side view representation of a hybrid feature/bevel etch chamber 600 and structure 611 operating in the feature etch mode. In this feature etch mode, substrate 614 is shown disposed on RF-powered lower electrode 604, which may be powered by one or more RE signals (using RF generators, not shown). The upper electrode assembly is shown to include upper PEZ ring 608 and upper electrode 602.

In the feature etch mode, upper PEZ ring 608 and lower PEZ ring 610 are made, in one or more embodiments, out of insulators such as yttria, yttria-coated alumina or a similarly suitable material.

In one or more alternative embodiments, upper FEZ ring 608 and/or lower PEZ ring 610 may be formed of an RF conductive material and insulated from adjacent components such that one or (preferably) both of these PEZ rings may be switchable between the ground state in the feature etch mode (or any state employed in the feature etch mode) and the RF floating state in the bevel etch mode. The RF switching may be performed using an analogous technique/arrangement employed to perform RE switching for the upper electrode (discussed later herein), for example.

Generally speaking, while in the feature etch mode, upper PEZ ring 608 and lower PEZ ring 610 do not operate to limit plasma penetration in the direction 616 (from bevel plasma region 612 toward the center region of the substrate). In fact, plasma is struck and intentionally sustained in region 638 above the feature region of substrate 614, including the region above substrate center region 620 of substrate 614, to perform feature etching.

Gap 606 is made sufficient large (by moving either the upper electrode assembly or the lower electrode assembly or both using appropriate actuator 603 arrangement(s)) to sustain the feature etch plasma 650 in region 638 above the feature region of the substrate. In an example feature etch scenario, gap 606 may range from about 1 cm to about 4 cm. In an embodiment, gap 606 is made larger than two times the largest sheath thickness achieved by any feature etch process being performed.

Upper electrode 602 may be either RE floating, RE powered, or RE ground (depending on feature etch process need) for feature etching. The exact RF state (i.e., RF floating, RF powered, or RF ground) of upper electrode 602 depends on the etch process being performed.

In the feature etch mode, upper PEZ ring 608 may be independently movable, at least in the vertical direction shown by arrow 622, relative to upper electrode 602 in one or more embodiments. The movement of upper PEZ ring 608 may be accomplished by an appropriate actuator 607 mechanism (which may be mechanical or electrical or pneumatic or hydraulic, for example, and may include gears or other force-transmission mechanisms). In another embodiment, upper PEZ ring 608 may be fixed relative to upper electrode 602 in the feature etch mode.

Alternatively or additionally, lower PEZ ring 610 may be independently movable, at least in the vertical direction shown by arrow 632, relative to lower electrode 604 in the feature etch mode in one or more embodiments. The movement of lower PEZ ring 610 may be accomplished by an appropriate actuator 609 mechanism (which may be mechanical or electrical or pneumatic or hydraulic, for example and may include gears or other force-transmission mechanisms). In another embodiment, lower PEZ ring 610 may be fixed relative to lower electrode 604 in the feature etch mode.

The lower (substrate-facing) surface of upper PEZ ring 60 may be made either co-planar or non-coplanar with the lower (substrate-facing) surface of upper electrode 602 in the feature etch mode. Likewise, the upper (substrate-facing) surface of lower PEZ ring 610 may be made either co-planar or non-coplanar with the upper (substrate-facing) surface of lower electrode 604 in the feature etch mode.

A gas distribution mechanism comprising a plurality of outlets is provided with the upper electrode assembly and preferably distributes, in the feature etch mode, etchant gas uniformly (or as uniformly as practicable) into feature plasma region 638 for forming the feature etch plasma 650 in feature plasma region 638. In an embodiment, at least some of the outlets (examples shown as outlets 640, 642, and 644 although the gas lines or gas manifolds coupled thereto are omitted to improve drawing clarity) are embedded in or provided with the lower (substrate-facing) surface of upper electrode 602 to facilitate relatively uniform etchant gas distribution into feature plasma region 638 in the feature etch mode.

Figure 7:
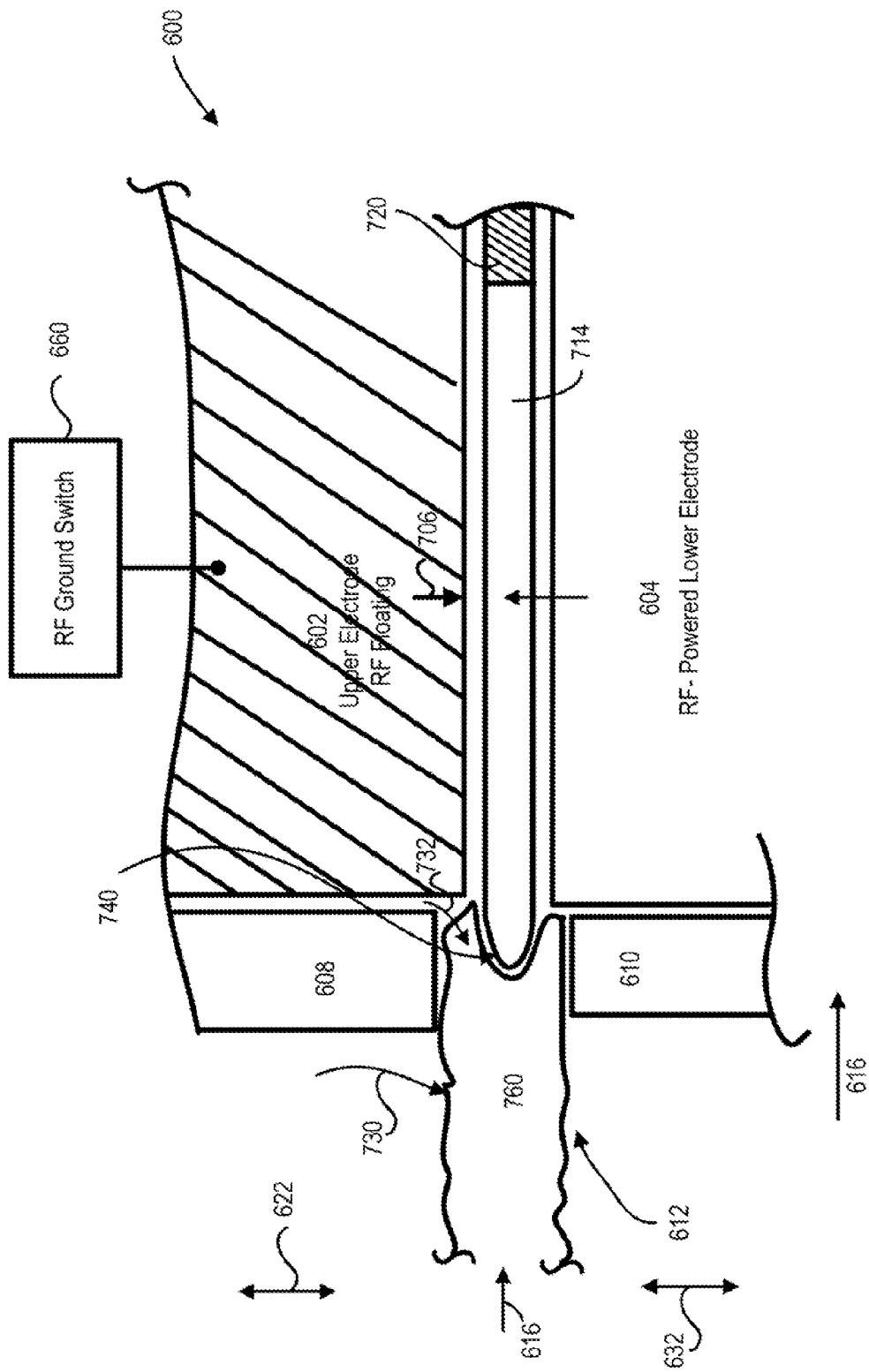
FIG. 7 shows, in accordance with an embodiment of the invention, another simplified side view representation of the hybrid feature/bevel etch chamber operating in the bevel etch mode.

FIG. 7 shows, in accordance with an embodiment of the invention, another simplified side view representation of the hybrid, feature/bevel etch chamber 600, which is operating in the bevel etch mode in FIG. 7. In this bevel etch mode, substrate 714 is shown disposed on RF-powered lower electrode 604, which may be powered by one or more RE signals as discussed. In the bevel etch mode, upper PEZ ring 608 and lower PEZ ring 640 actually operate to limit plasma penetration in the direction 616 (from bevel plasma region 612 toward the center region of the substrate).

In fact, a bevel etch plasma 760 is struck and intentionally sustained in region 612 adjacent to substrate periphery 740 from etchant gas released in one or more of streams 730, 732. These bevel etchant streams may flow along conduits or manifolds or channels built into the upper electrode assembly (such as through a part of the upper electrode assembly or in between adjacent parts of the upper electrode assembly). In an example, bevel etchant channels are created adjacent at least to one or more of the vertical surfaces of one or both PEZ rings 608 and 610, and bevel etchants are released through bevel etchant outlets at the end of such channels as streams 730 and 732 to form the bevel etch plasma 760. As mentioned, as buffer gas, such as argon, may be released into the gap above the feature region of the substrate (using one or more of outlets 640, 642 and 644 of FIG. 6 or a different gas distribution mechanism) to cause such buffer gas to flow toward the periphery of the substrate. Such buffer gas may function to, for example, increase the gas pressure to facilitate the formation of the optimal bevel etch plasma for bevel etching. Another function of the buffer gas may be to reduce the flow or penetration of bevel etchant gas species toward the center of the substrate where the features are exposed since etching of features is undesirable during bevel etch. Yet another function of the buffer gas may he to reduce the pressurization time of the process reactor when in bevel etch mode.

Most significantly, the bevel etch mode differs from the feature etch mode in at least two respects. First, the gap above the substrate center (and in fact above the entire feature region of the substrate) is deliberately set to suppress plasma formation at least above the substrate center and ideally above the entire feature region of the substrate (e.g., too small to sustain a plasma). For example, the gap 706 between the lower (substrate-facing) surface of upper electrode 602 and the upper surface of substrate 714 may be set at 0.5 mm or below in the bevel etch mode. In an example, gap 706 is set at 3.35 mm during one bevel etch application of the hybrid feature/bevel etch chamber. This gap is, in one or more embodiments, preferably less than the smallest sheath thickness achieved by any bevel etch process being performed. The setting of gap 706 may be achieved by moving either the upper electrode assembly or the lower electrode assembly or both, in one or more embodiments.

Secondly, upper electrode 602 is in the RF floating mode (and not the RF powered mode or RF grounded mode) during the bevel etch mode. This is to help prevent plasma from forming above the feature region by increasing the impedance for the RF for entering the upper electrode. High impedance due to a floating upper electrode forces the RF coupling to occur at the substrate periphery toward the upper grounded electrode (shown in FIGS. 8 and 9). The RF coupling will be between the substrate periphery and ground rings or ground surfaces (not shown to improve drawing clarity) disposed to the left of PEZ ring 608 and/or PEZ ring 610 in FIG. 7.

In order to satisfactorily transition from the feature etch mode to the bevel etch mode, the upper electrode (e.g., 602) may need to he switched from the RF powered or RF grounded. state (if such RF state is used during the feature etch mode) to the RF floating state using an appropriate RF ground switch. An implementation (but not a limiting example) of such an RF switch may be found in U.S. Pat. No. 7,393,432 ("RF GROUND SWITCH FOR PLASMA PROCESSING SYSTEM"), which is incorporated by reference herein. FIGS. 6 and 7 show such RF ground switch by reference number 660.

Further, in order to satisfactorily transition from the feature etch mode to the bevel etch mode, the upper electrode assembly or the lower electrode assembly or both need(s) to be moved in order to narrow the gap above the substrate feature region to prevent etching the features during bevel etching. At minimum, no plasma should exist above the substrate center region (e.g., above region 720 of FIG. 7). Further, etchant gas is released into the bevel plasma region 612 instead of into the feature plasma region 638 as the hybrid feature/bevel chamber performs bevel etching instead of feature etching. The outlets that dispense gases into the feature plasma region 638 may optionally be employed to provide buffer gas for the bevel plasma etch operation, for example. However, feature etchant gas is preferably not released into the gap above the substrate center region during bevel etching, in one or more embodiments. Furthermore, one or both PEZ rings 608 and 610 may be moved, in one or more embodiments if desired, in order to set the gap between the substrate-facing surfaces of the PEZ rings to control or tune or appropriately limit the bevel plasma penetration from bevel plasma 760 toward the substrate center.

In order to satisfactorily transition from the bevel etch mode to the feature etch mode, the upper electrode (e.g., 602) may need to be switched from the RF floating mode of the bevel etch mode to the RF powered state or RF grounded state of such RF state is employed in the feature etch mode). The RF switching of the tipper electrode 602 may be accomplished using the aforementioned RF ground switch, for example.

Further, in order to satisfactorily transition from the bevel etch mode to the feature etch mode, the upper electrode assembly or the lower electrode assembly or both need(s) to be moved in order to widen the gap above the substrate feature region to enable a feature etch plasma (e.g., feature etch plasma 650 of FIG. 6) to be formed to perform feature etching. Further, feature etchant gas is released into the feature plasma region 638 to facilitate formation of feature etch plasma 650 above the substrate feature region during the feature etch mode.

Figure 8:
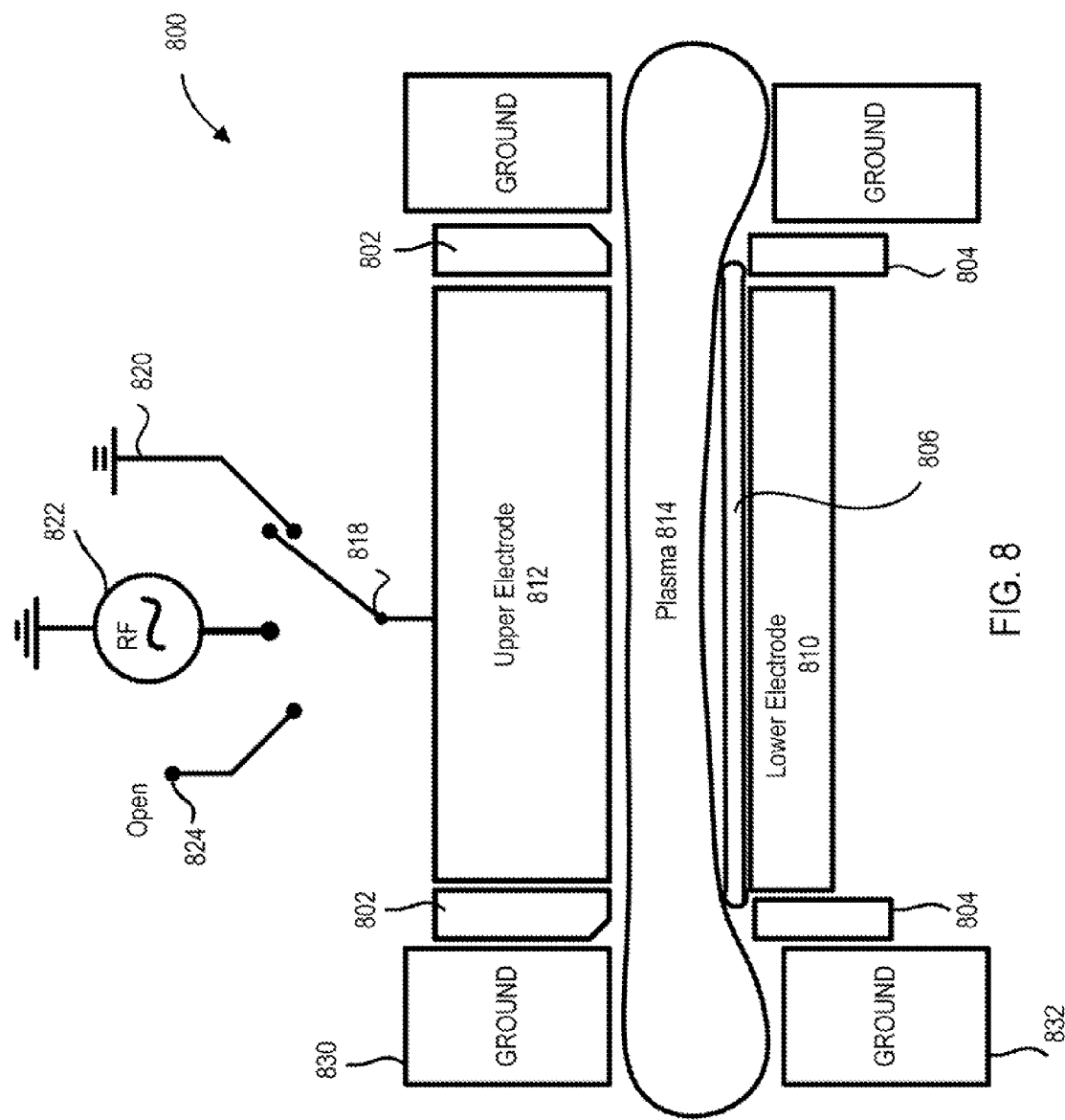
FIG. 8 is a cut-away drawing that conceptually shows another implementation of the hybrid plasma processing chamber while operating in the feature etch mode.

FIG. 8 is a cut-away drawing that conceptually shows another implementation of the hybrid plasma processing chamber 800 while operating in the feature etch mode. In this feature etch mode, the gap between the upper surface of substrate 806 (which is disposed on lower electrode 810 and the lower surface of upper electrode 812 is sufficiently large to sustain feature etch plasma 814 in the region above the center of substrate 806. Upper electrode 812 is shown coupled to an RF switch 818 that couples upper electrode 812 to ground terminal 820 in this feature etch example. Depending, on the feature etch requirements, upper electrode 812 may alternatively be coupled to RF source 822 or to RF open terminal 824 to render upper electrode 812 RF floating during feature etching. For completeness, upper PEZ ring 802 and lower PEZ ring 804 are also shown. These have been discussed earlier and will not be repeated here. Further, upper ground extension 830 and lower ground extension 832 are also shown. These ground extensions are conventional and will not be elaborated here.

Figure 9:
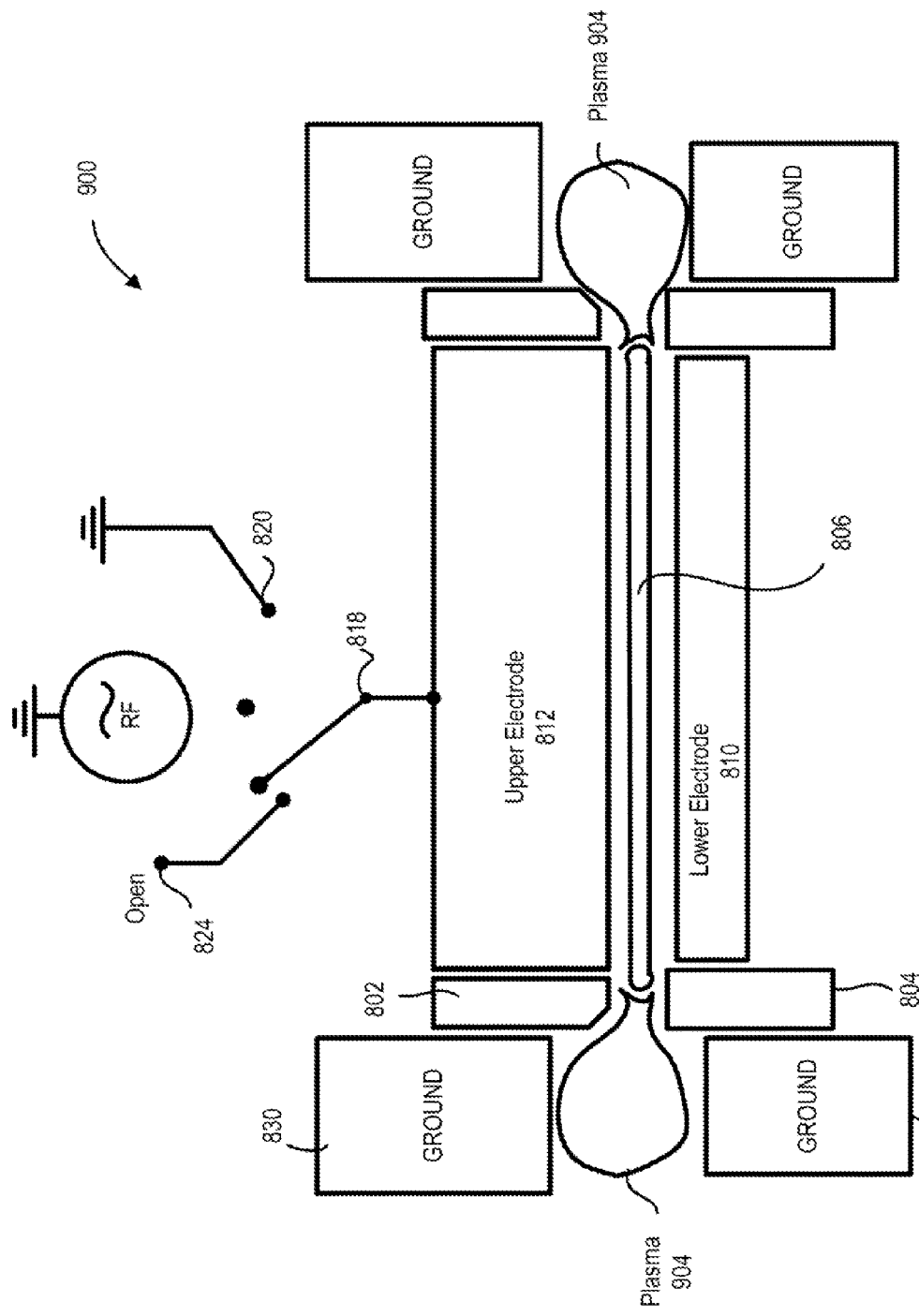
FIG. 9 is a cut-away drawing that conceptually shows another implementation of the hybrid plasma processing chamber while operating in the bevel etch mode.

FIG. 9 is a cut-away drawing that conceptually shows another implementation of the hybrid plasma processing chamber 900 while operating in the bevel etch mode. Hybrid chamber 900 of FIG. 9 and hybrid chamber 800 of FIG. 8 may represent the same physical hybrid chamber, albeit operating in different modes. In this bevel etch mode, the gap between the upper surface of substrate 806 (which is disposed on lower electrode 810) and the lower surface of upper electrode 812 is made narrow such that plasma cannot be sustained in the region above the center of substrate 806. This ensures that the bevel plasma cannot etch features during the bevel etch mode.

Compared to the feature etch situation in FIG. 8, note that both upper electrode 812 and upper PEZ ring 802 of the bevel etch mode of FIG. 9 have moved downward toward substrate 806 to narrow the gap above substrate 806. Although this embodiment shows both upper electrode 812 and upper PEZ ring 802 moving together, they can move separately from one another by the same distance or by different distances to create the optimal gap at the bevel edge for bevel etching. Upper electrode 812 is shown coupled to RF switch 818 that now couples upper electrode 812 to RF open terminal 824 to render upper electrode 812 RF floating during bevel etching. Bevel plasma 904 is shown existing at the bevel edge of substrate 806 to perform bevel etching on the bevel edge of substrate 806.

In one or more embodiments, the bevel etch mode occurs while the substrate is disposed on the upper surface of the lower electrode (i.e., the substrate is not raised above the upper or clamping surface of the lower electrode by the use of substrate-raising mechanisms such as pins to transition into or during the bevel etch mode). Instead of raising the substrate away from the lower electrode surface (which would require the use of additional mechanisms such as the substrate-raising mechanisms) in order to reduce the gap above the feature region of the substrate to transition from the feature etch mode into the bevel etch mode, one or more embodiments of the invention reduce the gap above the feature region by lowering the upper electrode (and reverse the aforementioned action to transition from the bevel etch mode into the feature etch mode). Other embodiments reduce the gap above the feature region of the substrate to transition from the feature etch mode into the bevel etch mode by raising the lower electrode (and reverses the aforementioned action to transition from the bevel etch mode into the feature etch mode). Still other embodiments combine the moving of the upper electrode and/or moving of the lower electrode and/or moving one or both oldie PEZ rings to facilitate the transition from the feature etch mode to the bevel etch mode and vice versa. In these embodiments, the substrate stays disposed on the upper surface of the lower electrode while transitioning from the feature etch mode to the bevel etch mode and vice versa.

As can be appreciated from the foregoing, embodiments of the invention provides for a chamber that is capable of performing either feature etching or bevel etching in a single chamber. By setting the gap appropriately, switching the RF state of the upper electrode, and controlling the appropriate etchant gas release, either the feature mode or the bevel etch mode may be executed in a single chamber, thereby eliminating the need to employ two separate chambers for the feature etching and bevel etching tasks.

While this invention has been described in terms of several preferred embodiments, there are alterations, permutations, and equivalents, which fall within the scope of this invention. Although various examples are provided herein, it is intended that these examples be illustrative, and not limiting with respect to the invention. It should be noted that while various embodiments are separately discussed to simplify understanding, some or all of the features and/or steps from various embodiments discussed herein may be combined (in any combination or order) in a given inventive hybrid plasma processing system. Also, the title and abstract are provided herein for convenience and should not be used to construe the scope of the claims herein.

What is claimed is:

1. A plasma processing system having at least a plasma processing chamber for processing a substrate using plasma, said substrate having at least a center region and a bevel edge region, comprising:
   a lower electrode configured for supporting said substrate during said processing;
   an upper electrode;
   an upper plasma exclusion zone (PEZ) ring disposed outside of an outer periphery of said upper electrode;
   a lower plasma exclusion zone (PEZ) ring disposed outside of an outer periphery of said lower electrode; and
   control logic to operate said plasma processing system in at least a first processing state and a second processing state, said control logic causing said plasma to be present above said center region of said substrate during said first processing state to at least perform plasma processing of said center region during said first processing state, said control logic causing said plasma to be absent above said center region of said substrate but present adjacent to said bevel edge region during said second processing state to at least perform plasma processing of said bevel edge region during said second processing state, said control logic further causing said upper electrode to be in an RF floating state during said second processing state, wherein said substrate is disposed on a surface of said lower electrode during both said first processing state and said second processing state,
   a first actuator interfaced with said control logic to move said upper electrode in a direction parallel to a chamber center axis of said plasma processing chamber to render a gap between a lower surface of said upper electrode and an upper surface of said substrate, when present, narrower in said second processing state relative to a cap between said lower surface of said upper electrode and said upper surface of said substrate, when present, that exists during said first processing state;
   a second actuator interfaced with said control logic to move said upper PEZ ring vertically in the direction parallel to the chamber center axis;
   a third actuator interfaced with said control logic to move said lower PEZ ring vertically in a direction parallel to the chamber center axis;
   wherein for the first processing state the control logic causes the first actuator to move the upper electrode away from the lower electrode, the second actuator to move a lower surface of the upper PEZ ring to be substantially coplanar to the lower surface of the upper electrode, and the third actuator to move an upper surface of the lower PEZ ring to be substantially coplanar to an upper surface of the lower electrode:
   wherein for the second processing state the control logic causes the first actuator to move the upper electrode toward the lower electrode, the second actuator to move the lower surface of the upper PEZ ring to be away from the lower surface of the upper electrode, and the third actuator to move the upper surface of the lower PEZ ring to be away from the upper surface of the lower electrode;
   an RF switch interfaced with said control logic, said control Magic is configured to cause the RF switch to set the upper electrode to other than said RF floating state during said first processing state and to said RF floating state during said second processing state.

2. The plasma processing system of claim 1 wherein the upper and lower PEZ rings move in a direction parallel to the chamber center axis of said chamber.

3. The plasma processing system of claim 1 wherein said upper electrode is in an RF powered state during said first processing state.

4. The plasma processing system of claim 1 wherein said gap between a lower surface of said upper electrode and said substrate is between about 1 cm and about 20 cm during said first processing state, said gap is below about 1 mm during said second processing state.

5. The A plasma processing system of claim 1, wherein the first processing state and the second processing state operate in a same chamber that is the plasma processing chamber.

6. A plasma processing system, comprising: a chamber, including, a lower electrode configured for supporting a substrate during a processing; an upper electrode;
   an upper plasma exclusion zone (PEZ) ring disposed outside of an outer periphery of said upper electrode;
   a lower plasma exclusion zone (PEZ) ring disposed outside of an outer periphery of said lower electrode; and
   control logic to operate said plasma processing system in a first processing state and a second processing state,
   a first actuator interfaced with said control logic to move said upper electrode in a direction parallel to a center axis of said chamber to render a gap between a lower surface of said upper electrode and an upper surface of said substrate, when present, narrower in said second processing state relative to a gap between said lower surface of said upper electrode and said upper surface of said substrate, when present, that exists during said first processing state;
   a second actuator interfaced with said control logic to move said upper PEZ ring vertically in the direction parallel to said center axis;
   a third actuator interfaced with said control logic to move said lower PEZ rind vertically in a direction parallel to said center axis;
   wherein for the first processing state the control logic causes the first actuator to move the upper electrode away from the lower electrode, the second actuator to move a lower surface of the upper PEZ ring to be substantially coplanar to the lower surface of the upper electrode, and the third actuator to move an upper surface of the lower PEZ ring to be substantially coplanar to an upper surface of the lower electrode;

wherein for the second processing state the control logic causes the first actuator to move the upper electrode toward the lower electrode, the second actuator to move the lower surface of the upper PEZ ring to be away from the lower surface of the upper electrode, and the third actuator to move the upper surface of the lower PEZ ring to be away from the upper surface of the lower electrode.

7. The plasma processing system of claim 6, further comprising, an RF switch interfaced with said control logic, said control logic is configured to cause the RF switch to set the upper electrode to other than a RF floating state during said first processing state and to said RF floating state during said second processing state.

8. The plasma processing system of claim 6, wherein said control logic causing said plasma to be present above a center region of said substrate during said first processing state to at least perform plasma processing of said center region during said first processing state.

9. The plasma processing system of claim 6, wherein said control logic causing said plasma to be absent above a center region of said substrate but present adjacent to a bevel edge region during said second processing state to at least perform plasma processing of said bevel edge region during said second processing state.

10. The plasma processing system of claim 6, wherein said control logic causing said upper electrode to be in an RF floating state during said second processing state, wherein said substrate is configured to be disposed on the upper surface of said lower electrode during both said first processing state and said second processing state.

11. The plasma processing system of claim 6,
wherein said gap between said lower surface of said upper electrode and said upper surface of said substrate during said first processing state is between about 1 cm and about 20 cm during said first processing state;
wherein said gap between said lower surface of said upper electrode and said upper surface of said substrate during said second processing state is below about 1 mm during said second processing state such that said plasma does not exists above a center region of said substrate, wherein said plasma exists in a bevel edge region during said second processing state.

12. The plasma processing system of claim 6, wherein said upper electrode is in an RF powered state during said first processing state.

13. The plasma processing system of claim 6, wherein the first processing state and the second processing state operate in a same chamber that is the plasma processing chamber.

* * * * *